United States Patent
Etherton et al.

(10) Patent No.: US 9,064,938 B2
(45) Date of Patent: Jun. 23, 2015

(54) I/O CELL ESD SYSTEM

(71) Applicants: Melanie Etherton, Austin, TX (US); Alexey Gilgur, Holon (IL); James W. Miller, Austin, TX (US); Jonathan M. Phillippe, Austin, TX (US); Robert S. Ruth, Austin, TX (US)

(72) Inventors: Melanie Etherton, Austin, TX (US); Alexey Gilgur, Holon (IL); James W. Miller, Austin, TX (US); Jonathan M. Phillippe, Austin, TX (US); Robert S. Ruth, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 127 days.

(21) Appl. No.: 13/905,275

(22) Filed: May 30, 2013

(65) Prior Publication Data

US 2014/0353727 A1 Dec. 4, 2014

(51) Int. Cl.
  *H01L 21/768* (2006.01)
  *H01L 23/535* (2006.01)
  *H01L 27/02* (2006.01)

(52) U.S. Cl.
  CPC ...... *H01L 21/76895* (2013.01); *H01L 27/0296* (2013.01)

(58) Field of Classification Search
  CPC ............ H01L 21/768; H01L 21/76895; H01L 23/535
  See application file for complete search history.

(56) References Cited

U.S. PATENT DOCUMENTS

| 6,385,021 | B1* | 5/2002 | Takeda et al. ................ 361/56 |
| 6,667,870 | B1 | 12/2003 | Segervall |
| 6,724,603 | B2 | 4/2004 | Miller et al. |
| 7,446,990 | B2 | 11/2008 | Miller et al. |
| 7,589,945 | B2 | 9/2009 | Miller et al. |
| 2004/0027742 | A1* | 2/2004 | Miller et al. .................. 361/52 |
| 2005/0078419 | A1* | 4/2005 | Stockinger et al. ............ 361/56 |
| 2006/0181823 | A1* | 8/2006 | Miller et al. .................. 361/56 |
| 2007/0097581 | A1* | 5/2007 | Khazhinsky et al. ......... 361/111 |
| 2008/0062596 | A1* | 3/2008 | Miller et al. .................. 361/56 |

OTHER PUBLICATIONS

ESD Association EDA Working Group, "ESD Electronic Design Automation Checks", pp. 1-6.

* cited by examiner

*Primary Examiner* — Benjamin Sandvik
*Assistant Examiner* — Fazli Erdem

(57) ABSTRACT

An integrated circuit including an ESD network including a portion located in ESD subareas of a plurality of I/O cells where the ESD subareas are arranged in a row traversing the plurality of I/O cells. The ESD network includes ESD clamp cells and ESD trigger circuit cells wherein a portion of the network is located in the row. In some examples, the row includes an ESD trigger circuit cell with a portion in one subarea of one ESD subarea of one I/O cell and a second portion in a second ESD subarea of another I/O cell. Also described herein is a method for producing an integrated circuit layout with an ESD network.

20 Claims, 6 Drawing Sheets

I/O CELL ESD SYSTEM

BACKGROUND

1. Field

This invention relates in general to electrostatic discharge (ESD) and more specifically to ESD circuitry arrangement in an integrated circuit.

2. Description of the Related Art

An integrated circuit may be subjected to a damaging Electrostatic Discharge (ESD) event in the manufacturing process, during assembly and testing, or in the ultimate system application. In conventional integrated circuit (IC) ESD protection schemes, special clamp circuits are often used to shunt ESD current between the power supply rails and thereby protect internal elements from damage. A type of ESD clamp circuit, known as an active Metal Oxide Semiconductor Field Effect Transistor (MOSFET) clamp circuit, typically comprises two parts: a trigger circuit and a large MOSFET clamp transistor. The conduction of the clamp transistor is controlled by the trigger circuit. Active MOSFET clamp circuits may be employed in networks distributed along the power buses to provide robust and consistent ESD protection for all the Input/Output (I/O) pads in the IC.

ESD circuitry can be implemented in many ways, but previous implementations require quite some added complexity in the supporting I/O library of standard cells (e.g. number of supported I/O cells increases significantly) and more complex I/O ring ESD integration rules. The placement of I/O cells to ensure compliance with design rules has largely been done manually.

BRIEF DESCRIPTION OF THE DRAWINGS

The present disclosure may be better understood, and its numerous objects, features, and advantages made apparent to those skilled in the art by referencing the accompanying drawings.

The use of the same reference symbols in different drawings indicates identical items unless otherwise noted. The figures are not necessarily drawn to scale.

DETAILED DESCRIPTION

Figure 1:
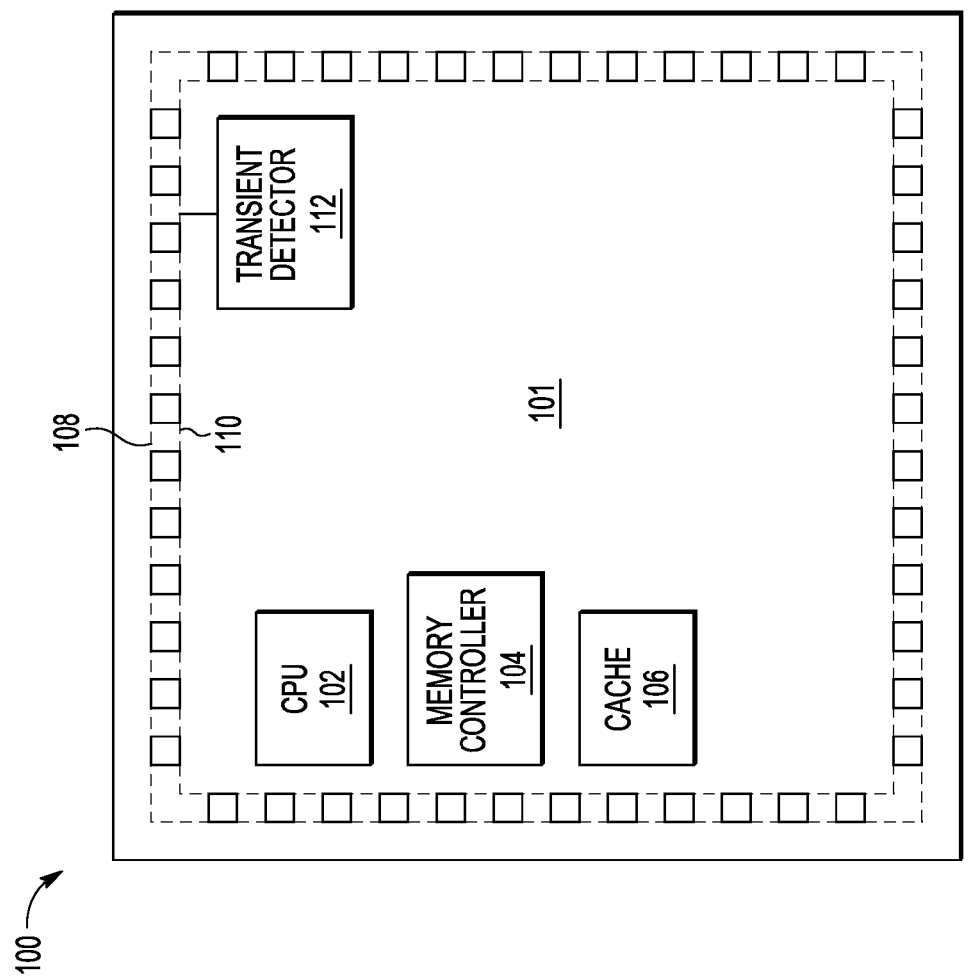
FIG. 1 is a top view of an integrated circuit device in accordance with at least one embodiment of the present disclosure.

The following sets forth a detailed description of various embodiments intended to be illustrative of the invention and should not be taken to be limiting. In embodiments of devices and methods disclosed herein, input/output (I/O) cells are implemented with a reserved space for ESD circuitry that is in a consistent location within each of the I/O cells such that a continuous slot is formed along one direction. The I/O cells are abutted next to each other to form an I/O bank. A distributed ESD network, including ESD clamp and ESD trigger circuit cells, is placed continuously in the available slot with clamp and trigger circuit placement following ESD rules and with the placement along the slot of the ESD circuitry being independent of the individual underlying I/O cells. An automated I/O ring build tool places the ESD circuitry based on the available total slot width and following defined ESD rules to achieve a correct implementation rather than each instance of the ESD circuitry being tied to a particular I/O cell. The ability to position ESD circuitry independently of the I/O cells, including the ability to place independent ESD trigger circuits to straddle adjacent I/O cells, removes design constraints and decreases the amount of time and effort required to develop and implement new circuit designs.

The term "I/O," as used herein, refers to input, output, or a combination thereof. Accordingly, the term "I/O cell," as used herein, refers to any of an input-only cell, an output-only cell, or a cell configurable as both an input cell and an output cell. The term "transistor device," as used herein, refers to a single transistor or an array of transistors, wherein the single transistor or some or all of the transistors of an array of transistors can be implemented as a single-segment transistor or as a transistor comprising a plurality of segments (or "fingers"). Therefore, when referring to the channel width of a clamp transistor device, it should be understood that this represents the total, cumulative channel width of all the transistor segments that are wired in parallel to form the clamp transistor device.

For purposes of discussion, the ESD protection techniques of the present disclosure are illustrated in the context of a microprocessor. However, the ESD protection techniques can be similarly employed in other types of electronic devices, such as application specific integrated circuits (ASICs), microcontrollers, systems-on-a-chip (SOCs), and the like. Further, although the circuit implementations disclosed herein are illustrated using metal oxide semiconductor (MOS) transistors, such as silicon substrate and silicon on insulator MOS field effect transistors (MOSFETs), other transistor types, such as bipolar junction transistors, Multiple Independent Gate FETs (MIGFETs) and other materials, such as silicon germanium, can be implemented as appropriate without departing from the scope of the present disclosure. In addition, though the clamp transistor devices are illustrated herein as n-channel MOSFETs, other clamp devices, including p-channel MOSFETs, two or more series n-channel or p-channel MOSFETs, a bipolar junction transistor, or semiconductor controlled rectifiers (SCR) may be used without departing from the scope of the present disclosure.

Referring to FIG. 1, an exemplary integrated circuit (IC) 100 (e.g., a microprocessor) implementing ESD protection is illustrated in accordance with at least one embodiment of the present disclosure. In the illustrated example, the IC 100 includes a substrate 101, a central processing unit (CPU) 102 and a plurality of peripheral components, such as a memory controller 104 and a cache 106. The IC 100 further includes a plurality of input/output (I/O) cells to receive signals from, and provide signals to, components external to the IC 100 through electrically conductive I/O pads 110. In the illustrated example, the plurality of I/O cells is implemented in an I/O cell bank 108 around the periphery of substrate 101. The I/O cell bank 108 includes I/O cells disposed at the substrate 101.

At least some of the I/O cells are connected to a first power domain referred to as a VDD bus and a VSS bus (not shown). Additional banks of I/O cells can be connected to separate power domains that use different voltages.

The IC 100 further includes a transient detector or trigger circuit 112 associated with I/O bank 108. The trigger circuit 112 has an output connected to a trigger bus (not shown), and inputs connected between the VDD bus and VSS bus. As illustrated, the trigger circuit 112 can be remote, or separate, from the I/O cells that form I/O cell bank 108. Alternately, the trigger circuit 112 can be implemented as part of the ESD network in the I/O cell bank 108. Further, in another alternate embodiment, some or all of the I/O cells can include a separate trigger circuit connected directly to a local ESD clamp transistor device.

Figure 2:
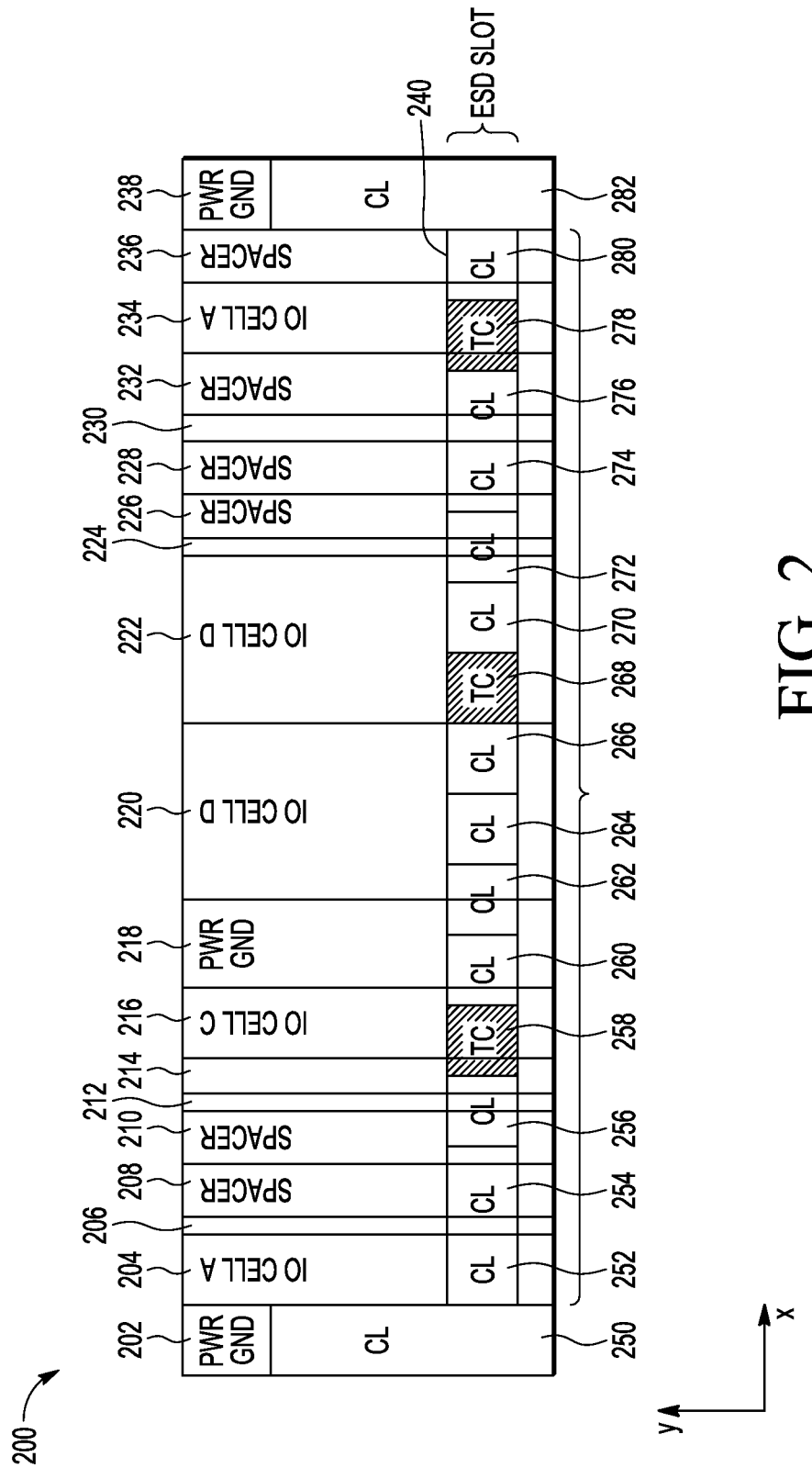
FIG. 2 is a block diagram illustrating a layout of an ESD protection network in accordance with at least one embodiment of the present disclosure.

Referring now to FIG. 2, a block diagram illustrating an exemplary layout floor plan for one embodiment of ESD protection network 200 is shown for a bank of I/O cells similar to I/O cell bank 108 in FIG. 1. Power/ground cells 202, 238 and associated clamp cells 250, 282 are included at either end of network 200. Next to power/ground cell 202 in order are I/O cell 204, spacers 206-214, I/O cell 216, power/ground cell 218, I/O cells 220-222, spacers 224-232, I/O cell 234, and spacer 236. A slot 240 designated for ESD circuitry is positioned in a row (along an x-axis) across a portion of I/O cells 204, 216, power/ground cell 218, I/O cells 220, 222, 234 and spacers 206-214, 224-232 and 236. Although slot 240 is shown close to the bottom within cells 204-236, slot 240 may alternatively be positioned near the top or an intermediate location relative to cells 204-236. Slot 240 as shown has a consistent height along a y-axis, as do cells 204-236. I/O cells can vary in height in some configurations, however.

Various types of I/O cells and spacer cells can include different circuitry and can therefore require more or less space than other cells. In the example shown, I/O cells 204, 216, power/ground cell 218, I/O cells 220, 222, 234 and spacers 206-214, 224-232, and 236 have the same height, but I/O cells 204 and 234 have a smaller width than I/O cells 216, 220, 222, and I/O cell 216 has a smaller width than I/O cells 220-222. Similarly, spacers 206, 212, 224 have a smaller width than spacers 208-210, 226-232, 236, spacers 214, 230 have a smaller width than spacers 208, 210, 226, 228, 232 and 236, and spacers 208, 226 have a smaller width than spacers 210, 228, 232 and 236. As a size reference, in an example embodiment, I/O cell A 204 has a width of 45 um and a height of 250 um. ESD slot 240 has a height of 48 um.

Spacer cells 206-214, 224-232, and 236 can also include circuitry that performs various functions, such as discharge capacitors for smoothing power supplied on the VDD bus or to continue a bus between active circuits. Although spacers may or may not include I/O circuitry, spacer cells 206-214, 224-232, and 236 and power/ground cell 218 may be collectively included in the term "I/O cells" herein because spacer cells 206-214, 224-232, and 236 and power/ground cell 218 include a consistent location for a portion of the ESD circuitry, such as slot 240. The position set aside for ESD circuitry in spacer and power/ground cells may be the same position as I/O cells.

Initially, clamp cells are placed continuously in slot 240. Some of the clamp cells are then replaced by trigger circuit cells 258, 268, 278 where needed to insure that a trigger signal is placed on the trigger bus to activate the clamp circuits when an ESD event is detected. Alternately, trigger circuits and clamps may be placed as needed in one step.

In the example shown, ESD slot 240 includes in order along the x-axis beginning with clamp cell 252 overlaying the width of I/O cell 204; clamp cell 254 overlaying the width of spacers 206, 208 and a portion of the width of spacer 210; clamp cell 256 overlaying a portion of the width of spacer 210, all of the width of spacer 212, and a portion of the width of spacer 214; trigger circuit cell 258 overlaying a portion of the width of spacer 214 and a portion of the width of I/O cell 216; clamp cell 260 overlaying a portion of the width of I/O cell 216 and a portion of the width of power/ground cell 218; clamp cells 262-266 overlaying respective portions of the width of I/O cell 220; trigger circuit cell 268 and clamp cell 270 overlaying respective portions of the width of I/O cell 222; clamp cell 272 overlaying a portion of the width of I/O cell 222, all of the width of spacer 224, and a portion of the width of spacer 226; clamp cell 274 overlaying a portion of the width of spacer 226 and all of the width of spacer 228; clamp cell 276 overlaying all of the width of spacer 230 and a portion of the width of spacer 232; trigger circuit cell 278 overlaying a portion of the width of spacer 232 and a portion of the width of I/O cell 234; and clamp cell 280 overlaying a portion of the width of I/O cell 234 and all of the width of spacer 236.

By designating a consistent, specific location for ESD circuitry cells in each I/O cell, a continuous slot 240 is formed in any bank of two or more I/O cells which allows for efficient placement of ESD trigger circuit cells and clamp cells as required to meet ESD design rules. Prior approaches, where individual ESD trigger circuits and clamp cells are associated with and fixed within a single I/O cell are less area efficient and require a larger number of unique ESD trigger circuit and clamp cells to fit in I/O cells of varying width. In FIG. 2, only two ESD circuitry cells (clamp cells and trigger circuit cells) are placed in the slot 240. These two cells are placed independently of the individual underlying I/O cells resulting in a simple and area-efficient solution for incorporating ESD circuitry. The ESD circuitry cells are implemented as overlays with required connections to the required power buses in the underlying I/O bank implemented automatically by the Electronic Design Automation (EDA) tools wherever the ESD cell is placed in continuous slot 240.

In the embodiment of FIG. 2, slot 240 is bounded on the right and left by power/ground cells 202, 238 containing clamp cells 250, 282. These clamp cells are larger in area than the clamp cells found within slot 240, and provide improved ESD protection at the ends of ESD network 200. In alternate embodiments, any type of I/O cell lacking a specific location for ESD circuitry cells corresponding to slot 240 may serve to bound slot 240 in an I/O bank. In other alternate embodiments, the ESD devices in slot 240 may be sized such that no special bounding cells are needed at the end of segments to provide adequate ESD protection.

Figure 3:
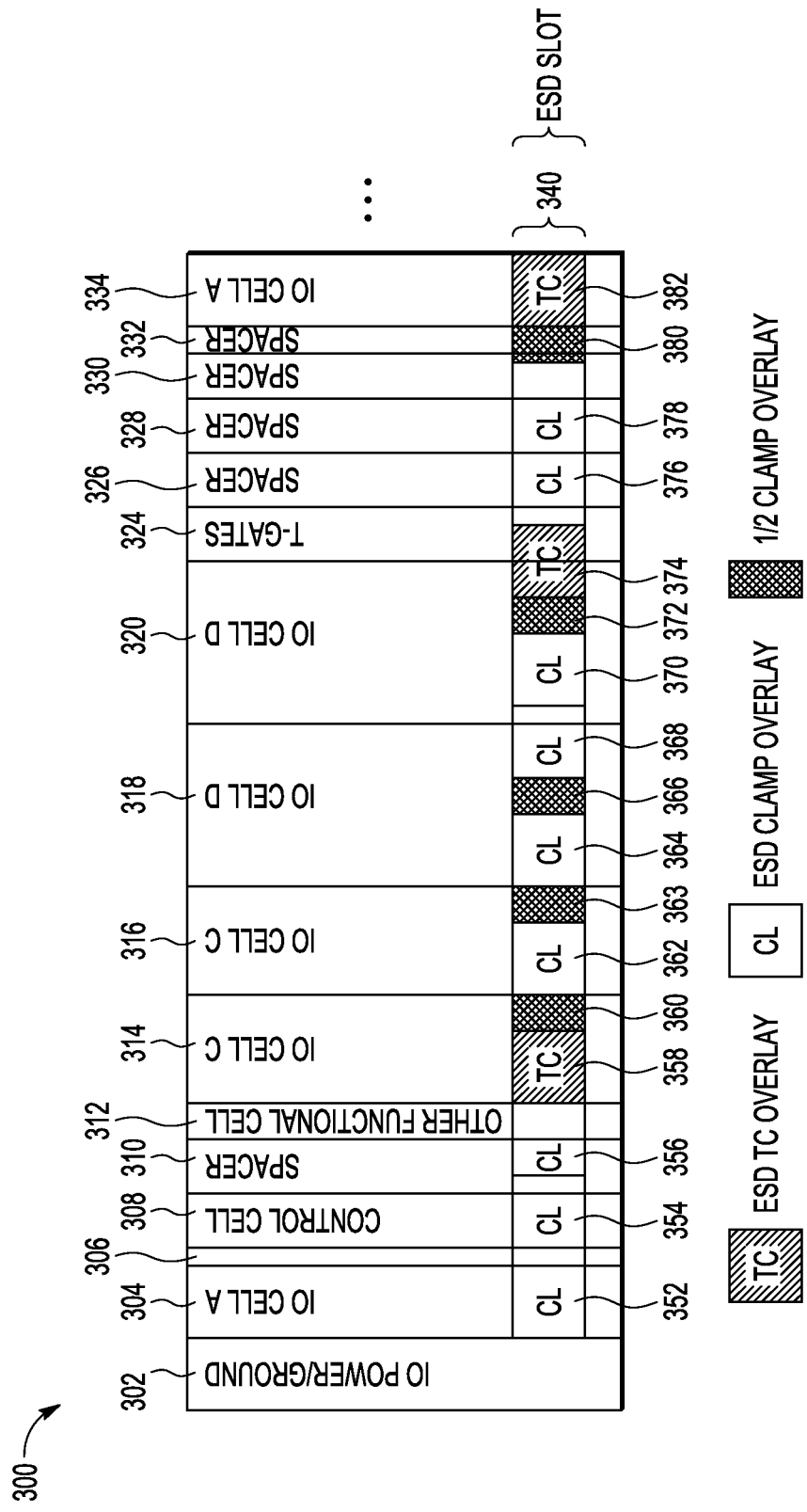
FIG. 3 is a block diagram illustrating a layout for another ESD protection network in accordance with at least one embodiment of the present disclosure.

FIG. 3 is a block diagram illustrating a layout for another embodiment of an ESD protection network 300 according to the present disclosure. I/O power/ground cell 302 is included at one end of network 300. Next to I/O power/ground cell 302 in order are I/O cell 304, spacer 306, control cell 308, spacer 310, other functional cell 312, I/O cells 314-320, T-gates 324, spacers 326-332 and I/O cell 334. Three dots are shown after I/O cell 334 to indicate that other cells can be included in network 300. A slot 340 designated for ESD circuitry is positioned in a row (along the x-axis) across a lower portion of cells 304-334, although slot 340 may alternatively be positioned near the top or an intermediate location relative to cells 304-334. Slot 340 as shown has a consistent height along a y-axis, as do cells 302-334.

The configuration of network 300 initially includes a group of clamp cells distributed along slot 340. Some of the clamp cells are then replaced by trigger circuit cells where needed to insure that a trigger signal is placed on the trigger bus to activate the clamp circuits when an ESD event is detected.

As shown, ESD slot 340 includes in order along the x-axis clamp cell 352 overlaying the width of I/O cell 304; clamp cell 354 overlaying the width of spacer 306, the entire width of control cell 308 and a portion of the width of spacer 310; clamp cell 356 overlaying a remaining portion of the width of spacer 310 and the entire width of other functional cell 312; trigger circuit cell 358 overlaying a first portion of the width of I/O cell 314 and half-clamp cell 360 overlaying a remaining portion of the width of I/O cell 314; clamp cell 362 overlaying a first portion of the width of I/O cell 316 and half-clamp cell 363 overlaying a remaining portion of the width of I/O cell 316; clamp cell 364 overlaying a first portion of the width of I/O cell 318, half-clamp cell 366 overlaying an intermediate portion of the width of I/O cell 318, and a first portion of clamp cell 368 overlaying a remaining portion of I/O cell 318; a remaining portion of clamp cell 368 overlaying a first portion of the width of I/O cell 320, clamp cell 370 overlaying a first intermediate portion of I/O cell 320, half-clamp cell 372 overlaying an second intermediate portion of the width of I/O cell 320, and a first portion of trigger circuit cell 374 overlaying a remaining portion of I/O cell 320; a remaining portion of trigger circuit cell 374 overlaying a first portion of the width of t-gates cell 324 and a first portion of clamp cell 376 overlaying a remaining portion of the width of t-gates cell 324; a remaining portion of clamp cell 376 overlaying the entire width of spacer cell 326; a first portion of clamp cell 378 overlaying the entire width of spacer cell 328 and a remaining portion of clamp cell 378 overlaying a first portion of the width of spacer cell 330; half-clamp cell 380 overlaying a remaining portion of spacer 330 and the entire width of spacer 332; and trigger circuit cell 382 overlaying the entire width of I/O cell 334.

ESD protection network 300 of FIG. 3 differs from ESD protection network 200 of FIG. 2 in that one-half width half-clamp cells (e.g. 360, 363) are placed in ESD slot 340 in addition to the standard width clamp cells. In an example embodiment the standard and half-clamp cells are 45 um and 22 micrometers wide, respectively. An advantage of having clamp cells of multiple widths is that it is easier to fill an ESD slot of any given width while minimizing gaps between clamp and trigger circuit cells. These gaps are undesirable and may degrade ESD performance of the IC. In alternate embodiments a wider range of clamp widths may be employed.

An advantage of the ESD networks illustrated in FIGS. 2 and 3 is that they may enable robust ESD protection for IC designs with widely varying widths of I/O cells, with only a few unique ESD elements. ESD trigger circuit cells and clamp cells may be placed in the designated ESD slot in any bank of two or more I/O cells as required to meet ESD design rules. ESD circuitry cells for clamp and trigger circuits are placed in a slot such as slot 240 (FIG. 2) independently of the individual underlying I/O cells resulting in a simple and area-efficient solution for incorporating ESD circuitry.

Figure 4:
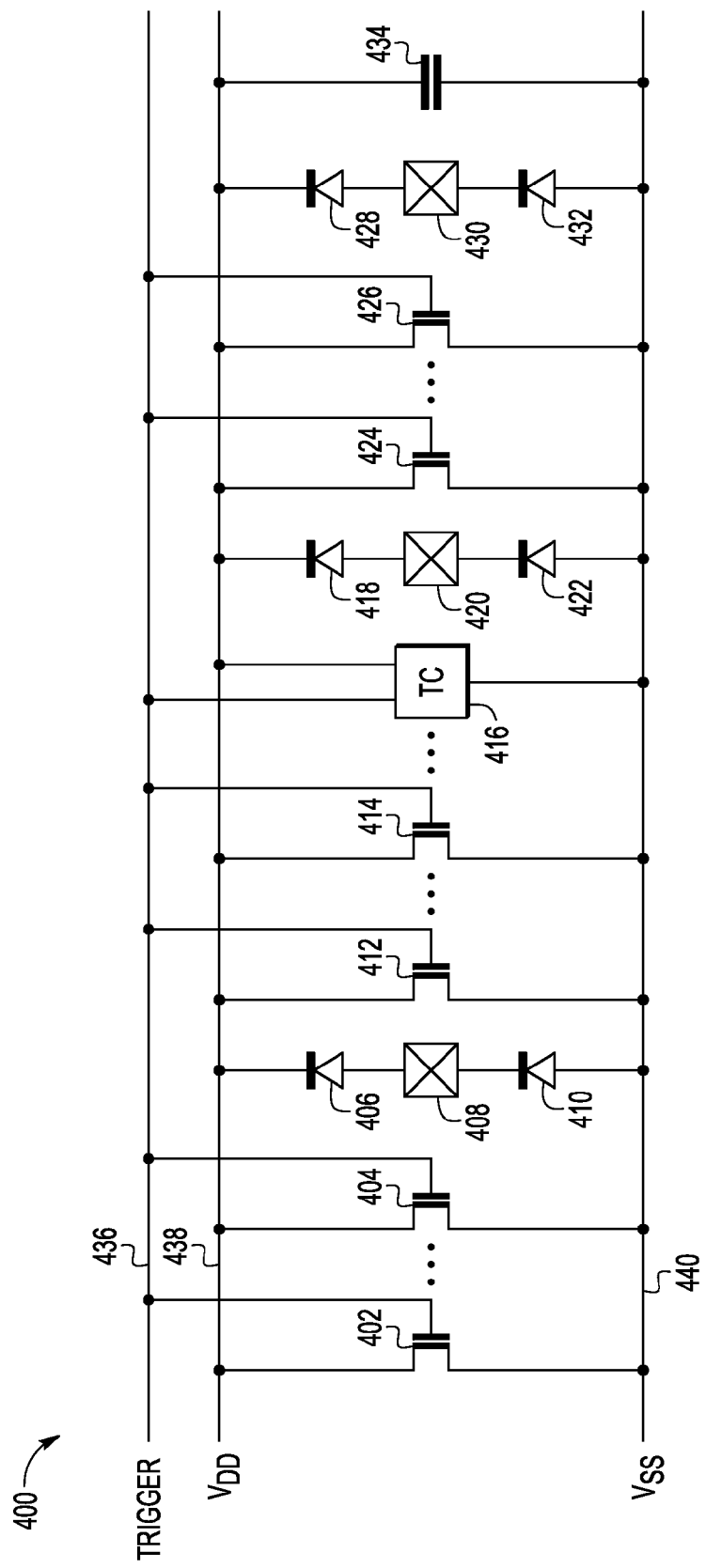
FIG. 4 is a schematic diagram illustrating an example of an ESD protection network in accordance with at least one embodiment of the present disclosure.

FIG. 4 is a schematic diagram illustrating an example of an ESD protection network 400 that can be used in an IC to protect I/O circuitry in a bank of I/O cells. The ESD protection network elements include, in order from left to right, clamp N-channel MOSFET (NMOSFET) 402, clamp NMOSFET 404, a first I/O cell including I/O pad 408 coupled between diodes 406, 410, clamp NMOSFET 412, clamp NMOSFET 414, trigger circuit 416, a second I/O cell including I/O pad 420 coupled between diodes 418, 422, clamp NMOSFET 424, clamp NMOSFET 426, a third I/O cell including I/O pad 430 coupled between diodes 428, 432, and discharge capacitor 434. Protection network 400 may encompass a larger bank of I/O cells, clamp circuits, trigger circuits and other circuit components around the IC periphery region as indicated by the dots placed to the left and right of some of the elements shown in FIG. 4. External connection I/O pads 408, 420, 430 are coupled between a VSS bus 438 and a VDD bus 436 via respective diodes 406, 410, 418, 422, 428, 432. Clamp NMOSFETs 402, 404, 412, 414, 424, 426 are connected between the VSS bus 440 and the VDD bus 438. The gates of clamp NMOSFETs 402, 404, 412, 414, 424, 426 are connected to a trigger bus 436.

Not shown in ESD network 400, but assumed present, is circuitry for normal (i.e. not ESD) I/O circuit operation. In addition to I/O cells, the I/O ring around the periphery of an IC typically contains power (VDD) and ground (VSS) cells, such as power/ground cells 202, 238 in FIG. 2.

Integrated circuits are often most susceptible to damage during positive ESD events coupled onto an I/O pad referenced to grounded VSS. The response of ESD network 400 to such an event applied to I/O pad 408 in FIG. 4 is as follows. Diode 406 forward biases as the I/O pad voltage very quickly ramps above about 0.8V. This produces a rapid voltage increase over time (dV/dt or voltage slew rate) on the VDD bus 438. Trigger circuit 416 may be of a type of trigger circuit that contains a resistor-capacitor (RC) based voltage slew rate sensor tuned to respond only to very fast ESD-related transients, and a series of inverting buffer stages to drive the trigger circuit output. In response to an ESD dV/dt transient on the VDD bus, trigger circuit 416 drives trigger bus 436 to the VDD bus voltage. This turns on the multiple clamp NMOSFETs 402, 404, 412, 414, 424, 426. Once turned on, this cumulative network of clamp NMOSFETs 402, 404, 412, 414, 424, 426 acts as a low resistance shunt between the VDD bus and the VSS bus. The clamp NMOSFETs remain conductive for a period of time which is determined by an RC time constant of the trigger circuit. The trigger circuit drives the clamp NMOSFETs 402, 404, 412, 414, 424, 426 for a period of time that exceeds the typical duration of an ESD event (e.g. 300-600 nanoseconds), yet avoids false triggering of the clamp NMOSFETs 402, 404, 412, 414, 424, 426 during normal ramp up of the VDD bus. With some examples, the VDD ramp-up during normal operation typically requires 1-5 microseconds.

Figure 5:
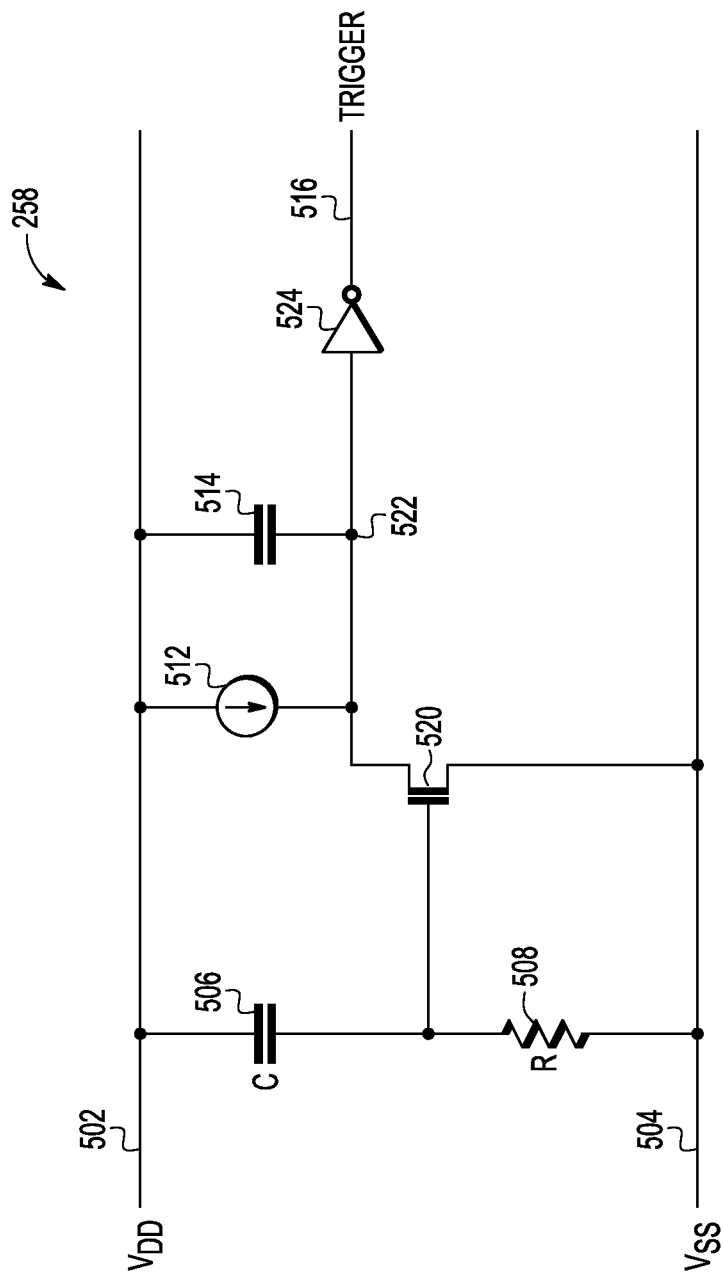
FIG. 5 is a schematic diagram illustrating an embodiment of a trigger circuit for an ESD protection network in accordance with at least one embodiment of the present disclosure.

Referring to FIG. 5, an exemplary prior-art trigger circuit 258 is illustrated. Although the trigger circuit 258 illustrates one suitable implementation, any of a variety of trigger circuits may be used to detect ESD events and provide a trigger signal in response without departing from the scope of the present disclosure. The trigger circuit 258 can be implemented as, for example, the transient detector 112 of FIG. 1 or trigger circuit 258 of FIG. 2.

Trigger circuit 258 includes an RC circuit of capacitive element 506 and resistive element 508 for detecting a dV/dt transient on the VDD bus 502 in the ESD range. If the voltage rise time is sufficiently short (e.g., 60 ns or less), the transistor 520 is turned on long enough to pull node 522 down to the voltage of the VSS bus 504 (logic level low). The inverter 524 then outputs a voltage equal to the VDD bus 502 (logical level high) on to trigger bus 516 to turn on the clamp transistor devices. The current source 512 and the capacitive element 514 act as a delay-on circuit for holding the input of the inverter 524 low for a period of time appropriate to fully discharge the ESD event.

It will be appreciated that FIG. 5 illustrates one type of trigger circuit that may be implemented in the ESD protection networks described herein. This trigger circuit may also be used for boosted ESD clamp transistor device networks by powering the trigger circuit with a boost bus rather than the VDD bus. Other types of ESD detecting trigger circuits may be implemented without departing from the scope of the present disclosure.

Figure 6:
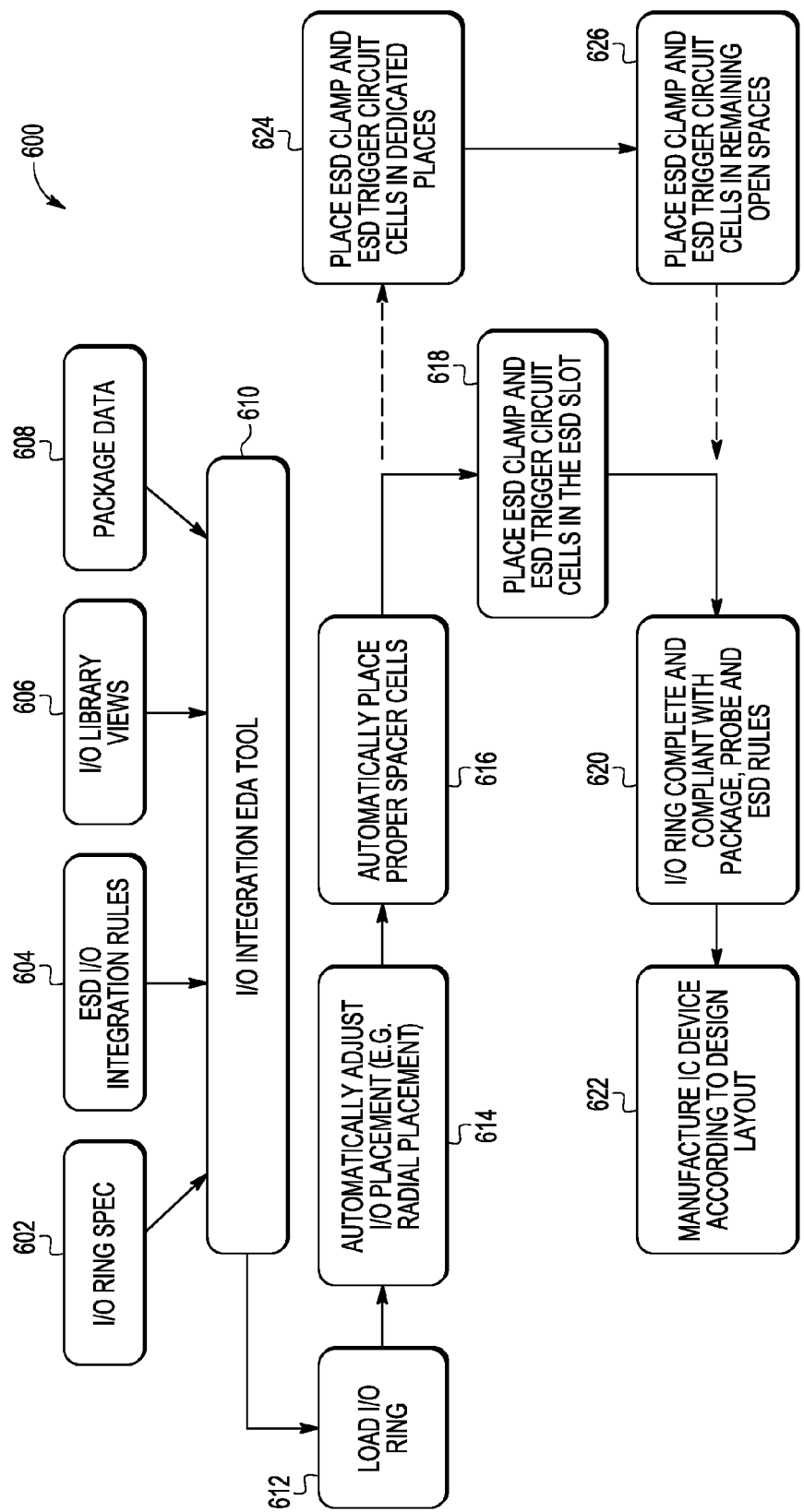
FIG. 6 is a flow diagram of a method for generating a layout of ESD protection network in accordance with at least one embodiment of the present disclosure.

FIG. 6 is a flow diagram of a method 600 for generating a layout of an I/O bank with an ESD protection network in accordance with at least one embodiment of the present disclosure. Method 600 may be implemented in an I/O padring integration EDA tool 610 that has a designer/user interface (not shown) and access to specifications 602 for an I/O ring, ESD I/O integration rules 604, I/O library cell views 606, and package data 608.

In process 612, the I/O ring is loaded including placement of the external I/O pads and associated I/O circuitry. The configuration of the I/O ring may be specified by the number and location of I/O pads, the signal(s) on each I/O pad, and connections to the IC die core region, among other specifications.

Process 614 includes automatically adjusting placement of the I/O cells in the area available and for the type of package used. Pads near the die corners are typically spaced wider apart than minimum. This radial spacing helps ensure uniform bond wire pitch during package assembly operations.

Process 616 includes automatically placing spacer circuitry cells in any I/O padring gaps created in previous processes. Spacer cells serve primarily to provide separation and power bus continuation between other I/O cells in I/O banks. The circuits in the spacer circuitry cells can also include circuitry to help smooth power (e.g. decoupling capacitors), or perform other suitable functions.

Process 618 includes placing ESD clamp and trigger circuit cells in the space designated for ESD protection cells, such as slot 240 in FIG. 2. The clamp and trigger circuit cells may overlap two or more I/O and/or spacer cells, or 2 or more clamp (and trigger circuit) cells may overlap a single I/O or spacer cell. The placement of clamp and trigger circuit cells complies with ESD I/O integration rules 604 and should result in a "correct-by-construction" implementation. The trigger circuit cells are placed so that a trigger signal is connected to the trigger bus to activate the clamp circuits when an ESD event is detected.

Process 620 includes verifying whether the completed I/O padring meets ESD requirements, test (probe) requirements, and package interface requirements. If the rules are met, the individual ESD circuits are verified to protect all components at each individual IP module and are operating in their ESD safe operating area for all stress combinations.

Process 622 includes manufacturing the IC device according to the final design layout. The manufacturing process can include forming one or more layers of transistors and other electronic components on a semiconductor wafer using known imaging, masking, deposition, etching, doping, and cleaning techniques. One or more metallization layers can be formed over the electronic components to interconnect the components with one another. A last metal layer is formed with contacts to connect the circuitry to the I/O pads when the IC device is packaged. The IC devices may then be tested on the wafer level using automated test equipment. The wafer is then cut into individual die, and the die that passed testing are connected to a package substrate by bonding the contacts on the IC device to bond pads on the package substrate. The IC device and package substrate are then encapsulated in a protective compound to form a packaged IC device. The package may be one of several different packages such as quad flat, flip chip, ball grid array, system in package, or multi-chip module, among others. The packaged IC devices are then further tested for proper operation before being shipped to customers.

In an alternate embodiment of method 600, process 618 is replaced by processes 624 and 626. In process 624, ESD clamp and trigger circuit cells are overlaid in the specified dedicated locations on the I/O cells. For example, a clamp cell may be added at the first portion of the width of every I/O cell and other types of I/O circuit cells such as spacer, power/ ground, control, and t-gates cells in the I/O ring. Trigger circuit cells are then added as required to meet ESD I/O integration rules 604. In process 626, additional ESD clamp and trigger circuit cells can be placed in any remaining open locations in the ESD slot to further protect the I/O circuitry.

By now it should be appreciated that in some embodiments, methods of making an integrated circuit 102 can include arranging 614, 616 a bank 300 of I/O cells in an integrated circuit layout, the bank including a plurality 304-334 of I/O cells, wherein each I/O cell of the plurality of I/O cells in the bank includes a designated ESD subarea the area of the row of 352-382, wherein the designated ESD subarea for each I/O cell of the plurality of I/O cells is aligned in a slot 340 traversing the plurality of I/O cells in the layout. After the arranging, a plurality of ESD clamp cells and at least one ESD trigger circuit cell for an ESD network are placed 618, 620 in the slot. The integrated circuit is then manufactured as per the layout.

In another aspect, after the manufacturing, the integrated circuit can include an ESD trigger circuit cell 258 of the at least one ESD trigger circuit cell, the ESD trigger circuit cell including a first portion in an ESD subarea of a first I/O cell 214 of the plurality of I/O cells and a second portion in an ESD subarea of a second I/O cell 216 of the plurality of I/O cells.

In another aspect, after the manufacturing, the integrated circuit can include an ESD clamp cell 272 of the plurality of ESD clamp cells including a first portion in an ESD subarea of a first I/O cell 222 of the plurality and a second portion in an ESD subarea of a second I/O cell 224 of the plurality of I/O cells.

In another aspect, after the manufacturing, the clamp cell 272 can include a third portion in an ESD subarea of a third I/O cell 226 of the plurality of I/O cells.

In another aspect, the placing can include placing in the layout a set of ESD clamp circuits in the slot followed by replacing at least one ESD clamp circuit of the set with the at least one ESD trigger circuit.

In another aspect, the placing can include placing the plurality of ESD clamp cells and the at least one ESD trigger circuit in the slot such the ESD network meets predefined ESD I/O integration rules.

In another aspect, each ESD subarea of the I/O cells of the plurality of I/O cells can be of a same size in a second direction, wherein the slot traverses the plurality of I/O cells in a first direction that is orthogonal to the second direction. For example, the ESD subareas can have the same width in the Y direction where the slot runs in the X direction.

In another aspect, a first I/O cell 318 of the plurality of I/O cells in the layout has a first size in a first direction and a second I/O cell 316 of the plurality of I/O cells has a second size different from the first size in the first direction. The slot traverses the plurality of I/O cells in the first direction. For example, the I/O cells can have different sizes in the X direction.

In another aspect, after the manufacturing, the plurality of ESD clamp cells can include a first subset of at least one ESD clamp cell 364 having a first size in a first direction and a second subset of at least one ESD clamp cell 366 having a second size in the first direction different from the first size.

The slot can traverse the plurality of I/O cells in the first direction. For example, the ESD clamp cells can have different sizes in the X direction.

In another aspect, the placing can include placing 624 a first subset of the plurality of ESD clamp cells at a first designated area of each ESD subarea of a first subset of I/O cells of the plurality of I/O cells. After the placing the first subset, the placing can include placing 626 a second subset of the plurality of ESD clamp cells at locations of the slot other than the first designated area of each ESD subarea of the first subset of I/O cells.

In another aspect, after the placing the first subset, the placing 620 can include placing the at least one ESD trigger circuit cell at locations of the slot other than the first designated area of each ESD subarea of the first subset of I/O cells.

In other embodiments, integrated circuits 102 can comprise a plurality of I/O cells located in a bank 200 of I/O cells, each I/O cell of the plurality of I/O cells occupying an area of the bank. An ESD network circuit portion can be located in the row of 252-280 within the bank, wherein the ESD network circuit portion includes a plurality of ESD clamp cells CL (e.g. 252) and at least one ESD trigger circuit cell TC (e.g. 258). Each I/O cell of the plurality can include an ESD subarea where the TCs and CLs are located. Each ESD subarea of the plurality of I/O cells can include a portion of the ESD network portion. Each ESD subarea of the I/O cells of the plurality can be aligned in a row 252-280 traversing the plurality of I/O cells. An ESD trigger circuit cell 258 of the at least one ESD trigger circuit cells can include a first portion located in an ESD subarea of a first I/O cell 214 of the plurality of I/O cells and a second portion located in an ESD subarea of a second I/O cell 216 of the plurality of I/O cells adjacent to the first cell. Note that ground and power cells can be considered an I/O cell. Additionally, spacer cells can be considered as I/O cells.

In another aspect, an ESD clamp cell 272 of the plurality of ESD clamp cells can include a first portion located in an ESD subarea of a third I/O cell 222 of the plurality of I/O cells and a second portion located in an ESD subarea of a fourth I/O cell 224 of the plurality of I/O cells adjacent to the third I/O cell.

In another aspect, the ESD clamp cell can include a third portion located in an ESD subarea of a fifth I/O cell 226 of the plurality of I/O cells.

In another aspect, an ESD clamp cell 256 of the plurality of ESD clamp cells can include a first portion located in the ESD subarea of the first I/O cell 214 and a second portion located in an ESD subarea of a third I/O cell 212 of the plurality of I/O cells.

In another aspect, the second I/O cell can be located on an opposite side of the first I/O cell from the third I/O cell.

In another aspect, each subarea of the I/O cells of the plurality of I/O can be of a same size in a second direction, wherein the row traverses the plurality of I/O cells in a first direction that is orthogonal to the second direction. The row is the same width in the Y direction wherein the row runs in the X direction.

In another aspect, the first I/O cell 220 can have a size in a first direction and the second I/O cell 218 has a second size different from the first size in the first direction, wherein the row traverses the plurality of I/O cells in the first direction.

In another aspect, the plurality of ESD clamp cells can include a first subset 364 of at least one ESD clamp cell having a first size in a first direction and a second subset 366 of at least one ESD clamp cell having a second size in the first direction different from the first size, wherein the row traverses the plurality of I/O cells in the first direction.

In another aspect, the integrated circuit can include a decoupling capacitor 434 in the row.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Some of the above embodiments, as applicable, may be implemented using a variety of different information processing systems. For example, although FIG. 7 and the discussion thereof describe an exemplary information processing architecture, this exemplary architecture is presented merely to provide a useful reference in discussing various aspects of the disclosure. Of course, the description of the architecture has been simplified for purposes of discussion, and it is just one of many different types of appropriate architectures that may be used in accordance with the disclosure. Those skilled in the art will recognize that the boundaries between logic blocks are merely illustrative and that alternative embodiments may merge logic blocks or circuit elements or impose an alternate decomposition of functionality upon various logic blocks or circuit elements.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of making an integrated circuit, the method comprising:
    arranging a bank of I/O cells in an integrated circuit layout, the bank including a plurality of I/O cells, wherein each I/O cell of the plurality of I/O cells in the bank includes a designated ESD subarea, wherein the designated ESD subareas are aligned in a continuous row traversing adjacent boundaries of the plurality of I/O cells in a layout;
    after the arranging, placing in the layout a plurality of ESD clamp cells and at least one ESD trigger circuit cell for an ESD network in the row;
    manufacturing the integrated circuit as per the layout.

2. The method of claim 1 wherein after the manufacturing, the integrated circuit includes an ESD trigger circuit cell of the at least one ESD trigger circuit cell, the ESD trigger circuit cell including a first portion in an ESD subarea of a first I/O cell of the plurality of I/O cells and a second portion in an ESD subarea of a second I/O cell of the plurality of I/O cells.

3. The method of claim 1 wherein after the manufacturing, the integrated circuit includes an ESD clamp cell of the plurality of ESD clamp cells including a first portion in an ESD subarea of a first I/O cell of the plurality and a second portion in an ESD subarea of a second I/O cell of the plurality of I/O cells.

4. The method of claim 3 wherein after the manufacturing, the clamp cell includes a third portion in an ESD subarea of a third I/O cell of the plurality of I/O cells.

5. The method of claim 1 wherein the placing includes placing in the layout a set of ESD clamp cells in the row followed by replacing at least one ESD clamp cell of the set with the at least one ESD trigger circuit cell.

6. The method of claim 1 wherein the placing includes placing the plurality of ESD clamp cells and the at least one ESD trigger circuit cell in the row such that the ESD network meets predefined ESD I/O integration rules.

7. The method of claim 1 wherein each ESD subarea of the I/O cells of the plurality of I/O cells is of a same size in a second direction, wherein the row traverses the plurality of I/O cells in a first direction that is orthogonal to the second direction.

8. The method of claim 1 wherein a first I/O cell of the plurality of I/O cells in the layout has a first size in a first direction and a second I/O cell of the plurality of I/O cells has a second size different from the first size in the first direction, wherein the row traverses the plurality of I/O cells in the first direction.

9. The method of claim 1 wherein after the manufacturing, the plurality of ESD clamp cells includes a first subset of at least one ESD clamp cell having a first size in a first direction and a second subset of at least one ESD clamp cell having a second size in the first direction different from the first size, wherein the row traverses the plurality of I/O cells in the first direction.

10. The method of claim 1 wherein the placing includes placing a first subset of the plurality of ESD clamp cells at a first designated area of each ESD subarea of a first subset of I/O cells of the plurality of I/O cells, wherein after the placing the first subset, the placing includes placing a second subset of the plurality of ESD clamp cells at locations of the row other than the first designated area of each ESD subarea of the first subset of I/O cells.

11. The method of claim 10 wherein after the placing the first subset, the placing includes placing the at least one ESD trigger circuit cell at locations of the row other than the first designated area of each ESD subarea of the first subset of I/O cells.

12. An integrated circuit comprising:
    a plurality of I/O cells located in a bank of I/O cells, each I/O cell of the plurality of I/O cells occupying an area of the bank;
    an ESD network circuit portion located within the bank, wherein the ESD network circuit portion includes a plurality of ESD clamp cells and at least one ESD trigger circuit cell;
    wherein each I/O cell of the plurality includes an ESD subarea, wherein each ESD subarea of the plurality of I/O cells includes a portion of the ESD network portion, wherein the ESD subareas are aligned in a continuous row traversing the plurality of I/O cells, with one or more independent ESD circuits straddling adjacent I/O cells of the plurality of I/O cells;
    wherein an ESD trigger circuit cell of the at least one ESD trigger circuit cells includes a first portion located in an ESD subarea of a first I/O cell of the plurality of I/O cells and a second portion located in an ESD subarea of a second I/O cell of the plurality of I/O cells.

13. The integrated circuit of claim 12 wherein an ESD clamp cell of the plurality of ESD clamp cells includes a first portion located in an ESD subarea of a third I/O cell of the plurality of I/O cells and a second portion located in an ESD subarea of a fourth I/O cell of the plurality of I/O cells adjacent to the third I/O cell.

14. The integrated circuit of claim 13 wherein the ESD clamp cell includes a third portion located in an ESD subarea of a fifth I/O cell of the plurality of I/O cells.

15. The integrated circuit of claim 12 wherein an ESD clamp cell of the plurality of ESD clamp cells includes a first portion located in the ESD subarea of the first I/O cell and a second portion located in an ESD subarea of a third I/O cell of the plurality of I/O cells.

16. The integrated circuit of claim 15 wherein the second I/O cell is located on an opposite side of the first I/O cell from the third I/O cell.

17. The integrated circuit of claim 12 wherein each subarea of the I/O cells of the plurality of I/O is of a same size in a second direction, wherein the row traverses the plurality of I/O cells in a first direction that is orthogonal to the second direction.

18. The integrated circuit of claim 12 wherein the first I/O cell has a size in a first direction and the second I/O cell has a second size different from the first size in the first direction, wherein the row traverses the plurality of I/O cells in the first direction.

19. The integrated circuit of claim 12 wherein the plurality of ESD clamp cells includes a first subset of at least one ESD clamp cell having a first size in a first direction and a second subset of at least one ESD clamp cell having a second size in the first direction different from the first size, wherein the row traverses the plurality of I/O cells in the first direction.

20. The integrated circuit of claim 12 includes a decoupling capacitor in the row.

* * * * *